United States Patent [19]

Sabet-Peyman

[11] Patent Number: 4,908,543

[45] Date of Patent: Mar. 13, 1990

[54] ACOUSTIC TRANSDUCER

[75] Inventor: Farhang Sabet-Peyman, San Jose, Calif.

[73] Assignee: Litton Systems, Inc., Beverly Hills, Calif.

[21] Appl. No.: 70,891

[22] Filed: Jun. 30, 1988

[51] Int. Cl.[4] .......... H01L 41/08

[52] U.S. Cl. .......... 310/334; 310/366

[58] Field of Search .......... 310/334–336, 310/366, 313 R

[56] References Cited

U.S. PATENT DOCUMENTS

| | | | |
|---|---|---|---|
| 3,453,711 | 7/1969 | Miller | 310/334 X |
| 3,587,005 | 6/1971 | Fair | 310/313 R X |
| 3,621,309 | 11/1971 | Yokoyama et al. | 310/334 X |
| 4,329,876 | 5/1982 | Chen et al. | 73/618 |
| 4,385,255 | 5/1983 | Yamaguchi et al. | 310/335 |
| 4,399,387 | 8/1983 | Kohji | 310/334 |
| 4,473,769 | 9/1984 | Nguyn | 310/334 |
| 4,604,543 | 7/1986 | Hachiouji et al. | 310/334 |
| 4,692,653 | 9/1987 | Kushida et al. | 310/334 |

OTHER PUBLICATIONS

Bulk Acoustic Wave Transducer for High-Resolution Laser Beam Deflection, by L. Kuhn, IBM Technical Disclosure Bulletin, vol. 5, No. 10, Mar. 1973, pp. 3275–3276.

*Primary Examiner*—Mark O. Budd
*Attorney, Agent, or Firm*—Roy L. Brown

[57] ABSTRACT

An acoustic transducer with a piezoelectric acoustic oscillator member that has a first surface with a common electrode, and a second surface with a predetermined electrode pattern. In some instances the electrodes are individually connected off of the transducer. In other instances some of the electrodes are connected together in sets. Each set is then connected off of the transducer. The individually connected electrodes are connected to an adjacent pedestal supporting a pad that is adapted to be soldered or wired to a wire member. When the electrodes are connected together in sets, the connecting member is supported on a plateau or pedestal so that a wire may be connected to any part of the connector. In one preferred embodiment, where two sets of electrodes are connected to two connectors, the connectors are parallel conductive side rods positioned on opposite edges of and adjacent to the oscillator member.

The connectors or pads are sufficiently built up that the electric field produced by voltage distributions on such connectors or pads, and they do not influence the steering of the acoustic beam launched by the transducer.

12 Claims, 4 Drawing Sheets

ACOUSTIC TRANSDUCER

RELATED APPLICATIONS

This application is related to a patent application entitled, "Broad Band Bulk Acoustic Wave Spectrum Analyzer/Channelizer", Ser. No. 068,156, filed the same date as this application by Farhang Sabet-Peyman and I-Cheng Chang, and assigned to the same assignee.

This application is also related to copending patent application, Ser. No. 070,839, entitled "Angle of Arrival Processor Using Bulk Acoustic Waves", and having the same filing date, invented by Farhang Sabet-Peyman, and assigned to the same assignee.

BACKGROUND OF THE INVENTION

This invention relates generally to an acoustical transducer having an electrode configuration to launch a steered acoustical beam into a bulk acoustic wave body for signal processing. For example, the transducer may be used to determine the angle of arrival and/or frequency of electromagnetic waves.

Various prior art transducers are used to launch acoustic beams, but they typically do not steer the beam. Other apparatus such as diffraction gratings are used with a single transducer to process signals at radio frequencies. It is important to process a wide band of high frequency signals with a high dynamic amplitude range. Neither surface acoustic wave devices nor microwave superconducting strip transmission devices achieve high dynamic amplitude ranges over a wide band.

BRIEF DESCRIPTION OF THE INVENTION

The transducer of this invention is specifically adapted to BAW use which does have a wide bandwidth and a high dynamic amplitude range. It is intended that the transducer shall be used to launch bulk acoustical waves into a bulk acoustic wave body which may be a crystalline or amorphous, usually solid, body that efficiently transmits bulk acoustic waves. Typical examples of such materials are lithium niobiate, spinel, yttrium- aluminum-garnet, yttrium-gallium-garnet, or yttrium-iron-garnet.

The transducers of the transducer set are piezoelectric transducers which may be fabricated, for example, from a platelet of lithium niobiate. The platelet may be attached by a thin metal film electrode to the surface of a bulk acoustic body.

The transducer may, if desired be of zinc oxide grown or sputtered directly onto the bulk acoustic wave body.

The individual transducers are then frequently isolated by dielectric separators from the remainder of the transducers of the platelet. Dielectric pedestals may be used to support conductor areas. Dielectric wells may extend into the bulk acoustic wave body.

A first transducer embodiment of the invention is a phased input array of transducers capable of steering the created acoustic signals into a pattern wherein the angle of steering depends upon the frequency of the received signal.

A second embodiment of the transducer of the invention is a transducer set with individual transducers arranged to steer the created acoustic signals into a pattern wherein the angle of steering depends upon the angle of arrival of the received signal.

The transducer piezoelectric oscillator member may be either a platelet or a built-on or sputtered thin film layer of piezoelectric material, bonded or fastened, by a metallic electrode, to a surface of a bulk acoustic wave body.

The metallic bonding layer also functions as a common electrode for the piezoelectric element.

The acoustic transducer uses a piezoelectric acoustic oscillator member that has a first surface with a common electrode, and a second surface with a predetermined electrode pattern. In some instances the electrodes are individually connected, and in other instances electrodes are connected in subsets of electrodes, to apparatus external to the transducer. Because the active regions are very thin, they will not accept heat or force. Thus, the individually connected electrodes are connected to an adjacent dielectric pedestal supporting a conductive pad that is adapted to be welded to a wire member. When the electrodes are electrically connected together in sets, the connecting member is supported on a plateau or pedestal so that a wire may be welded or otherwise connected to any part of that connecting member. In one preferred embodiment, where two subsets of electrodes are each connected to different connectors, the connectors are parallel conductive side rods, positioned on opposite edges of and adjacent to the oscillator member.

The connectors or pads are sufficiently built away from the oscillator member that the electric field produced by voltage distributions on such connectors or pads do not influence the steering of the acoustic beam launched by the transducer.

The transducer structure piezoelectric member is sometimes called the "oscillator member" or "active region". In one configuration, the active region is all one piezoelectric region with a pattern of electrodes thereon. The electrodes create an electric field in the portion of the oscillator member closest to the electrode. The influence of electric fields caused by more distant electrode voltages is negligible.

In other instances dielectric barriers penetrate through the transducer sheet, forming individual lisolated transducers, one adjacent each electrode. This latter structure is preferred, but it frequently is not needed for a particular transducer use.

The first embodiment of the invention has a phased array of electrodes for the patent apparatus of the application, "Broad Band Bulk Acoustic Wave Spectrum Analyzer/Channelizer," mentioned above in the first paragraph, the electrode pattern on the surface of the active piezoelectric oscillator region of the input transducer has a pair of intermeshed comb electrode arrays to form a phased array of metallic, parallel, spaced-apart finger-electrode members which are formed, deposited, sputtered or otherwise attached to the active region. The spacing between the finger-electrode members is determined by the desired angular sensitivity of the beam steering to the input frequency. Alternate ones of the finger-electrode members are conductively connected together, and the remaining alternate ones of such finger-electrode members are also conductively connected together. That is, if the finger-electrode members are sequentially numbered from one end of the array to the other, the odd numbered finger-electrode members are conductively connected together by a conductive side rod, and the even numbered finger-electrode members are conductively connected together by a second conductive side rod. The side rods are positioned on opposite ends of the finger-electrode members of the array and on opposite edges of the transducer. Although the two sets of finger-electrode members intermesh, each electrode has a short insulating space at its distal end adjacent the side rod not attached to that particular electrode.

The side rods are supported upon dielectric pedestals that are either placed, grown or sputtered onto the bulk acoustic wave body and built higher than the active piezoelectric regions. Thus, the voltage distribution on the side rods does not affect the beam steering of acoustic waves.

The second embodiment of the invention has a plurality of individual transducer electrodes and transducers for the patent application "Angle of Arrival Processor Using Bulk Acoustic Waves" mentioned above in the second paragraph. It is used on the BAW body to steer an acoustic beam in response to the arrival angle of a radio or radar signal. Each of the plurality of individually scattered electrodes on the transducer's outer face has an electrode pad for welding or otherwise attaching external wires.

Preferably, a thin sheet of bonding metal, such as gold, is attached by a flash coat of another metal, such as chromium or chromium-nickel, to both the BAW body and a piezoelectric transducer platelet. The two metal layers are then pressed together and heated, if desired, to bond them together.

The transducer, attached to the BAW body, is next milled, ground and polished to thicknesses which may be smaller than a micron.

It is desired that only certain portions of the transducer remain piezoelectrically active. Adjacent areas are built into dielectric platforms or posts to support electrode connectors. For example, a pad or side rod may be positioned atop a platform adjacent to each of the active electrodes, which are the electrodes that overlay an active region of a transducer.

The dielectric platforms or posts usually extend into isolation wells in the bulk acoustic wave body. To form the wells, the portions of the piezoelectric member that are to remain active or piezoelectric are masked off by a resist layer. The member is then bombarded with ions to etch out the wells in the piezoelectric material, the underlying metallic layers, and into the BAW body.

To build up the platforms or pedestals for supporting the connector pads or side rods, without removing the resist layer, the entire surfaces of the remaining piezoelectric segments are covered with a dielectric material. Typical dielectric material is aluminum oxide and silicon oxide. The dielectric extends into and fills the wells. The dielectric thickness is not critical, but it needs to be thick enough to support the electrode pads and side rods with sufficient rigidity that external wires may be attached. Because of the remaining resist material, the dielectric material over that resist material peels away, leaving the active dielectric regions ready to receive an energizing electrode.

A resist material is then applied, in the usual fashion, to the outside of the dielectric and the active piezoelectric regions, with the portions to receive conductive material for electrodes, pads and side rods in a predetermined pattern. Metal conductive material is then formed on the outside of the dielectric material and the active piezoelectric regions.

It should also be noted that the transducer is bidirectional in that it may be energized by an acoustical beam to generate voltages at the electrodes. Such voltages, for example, could be used to energize transmitter antennas.

It is therefore an object and feature of this invention to receive electric signals, to transduce such signals into acoustic signals and to direct or steer such acoustic signals, according to their frequency.

It is also an object and feature of this invention to receive electric signals, to transduce such signals into acoustic signals and to direct or steer such acoustical signals, according to their direction of arrival to an antenna system.

It is also an object of this invention to use a novel electrode configuration on a piezoelectric transducer for steering a produced acoustic beam.

It is a more specific object of this invention for such an electrode configuration to use a plurality of electrode arrays on such transducer, each having a conductive side rod and a plurality of spaced-apart, substantially parallel comb finger-electrode members, the finger-electrode members of said arrays intermeshing to form a phased array wherein the individual juxtaposed finger-electrode members are insulated from each other and said side rods are positioned on built-up dielectric regions to be connectable to external wiring.

It is likewise a more specific object of this invention for such an electrode configuration to use a plurality of separate electrodes on separate regions of said transducer, and a separate built-up electrode pad adjacent said regions with each connected to a separate said electrode to be connectable to external wiring.

It is a further feature and object of this invention to provide a transducer that is bidirectional to produce electrical signals in response to acoustical signals, and to produce acoustical signals in response to electrical signals.

Other objects will become apparent from the following description taken in connection with the accompanying drawings.

DETAILED DESCRIPTION OF THE INVENTION

Figure 1:
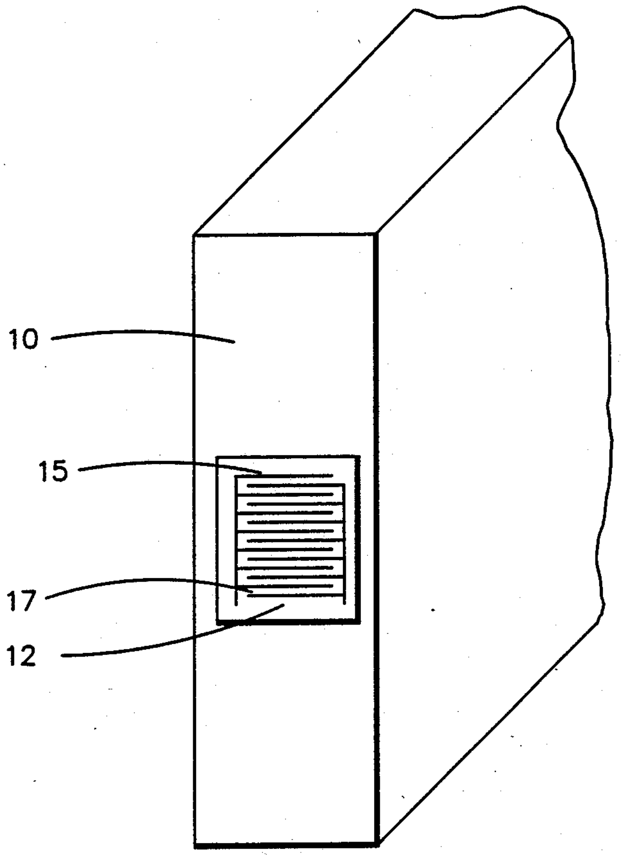
FIG. 1 is a sketch of a transducer attached to a bulk acoustic wave body.

As shown in FIG. 1, a transducer 12 is attached to a receiving bulk acoustic wave body 10 to deliver acoustic wave beams to the body.

In a first electrode embodiment, finger-electrode members 15 and 17 are adapted to receive and be driven by electrical signals which are typically in the radio frequency range of 100 to 4000 Mhz. As shown in FIGS. 3-5 and 7, positioned on and attached, by a conductive electrode 14, to a surface of a bulk acoustic wave body 10. When the member 18 is a platelet, it is important that the surface of the body 10 underlying member 18 be substantially flat.

Typical transducer material for a flat transducer is an appropriately cut bonded Lithium Niobiate transducer. For a curved transducer for mounting on a curved surface, a thin film type transducer such as zinc oxide may be used.

Figure 2:
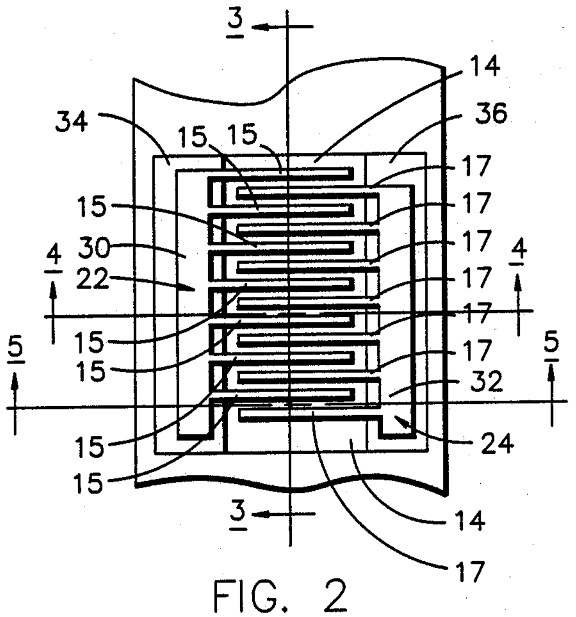
FIG. 2 is a top view of the outside of one embodiment of the transducer of the invention.
Figure 3:
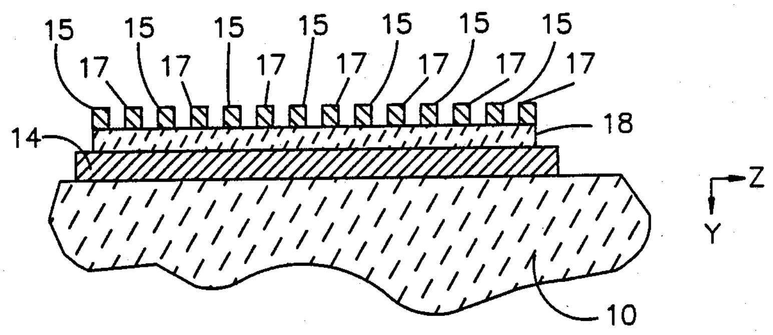
FIG. 3 is a sectional view, taken at 3—3 in FIG. 2.
Figure 4:
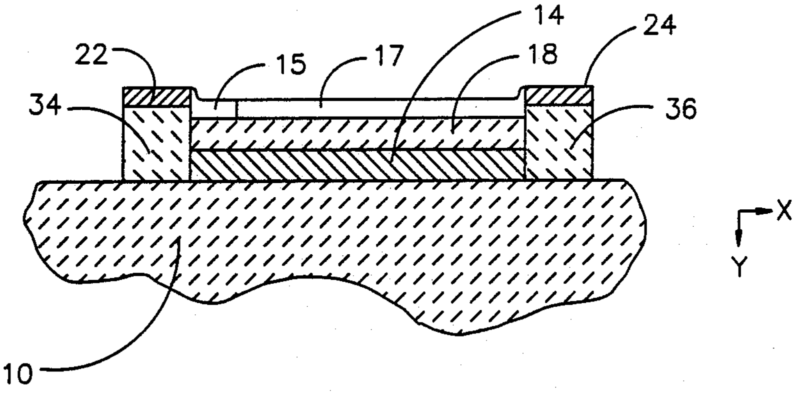
FIG. 4 is a sectional view, taken at 4—4 in FIG. 2.
Figure 5:
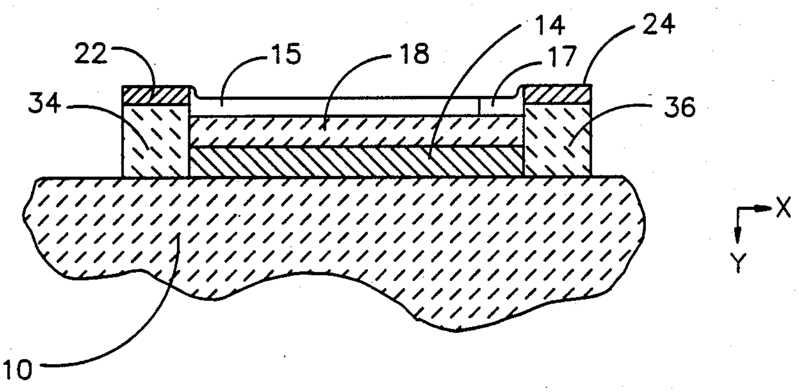
FIG. 5 is a sectional view, taken at 5—5 in FIG. 2.

As shown in FIG. 2 and sectional views of FIGS. 3–5, the electrode configuration on the outer surface of the piezoelectric oscillator member 18 is a phased array having two comb electrode sets 22, 24 with equal pluralities of uniformly spaced interdigitated, juxtaposed finger- electrode members 15, 17. In FIGS. 3–5, X-Y-Z coordinates are shown. The largest surfaces of the transducers are substantially flat with the X-Y-Z coordinates defined in the oscillator member 18. The sides of the largest members are parallel to the X and Z coordinates, with the side rods 30, 32 parallel to the Z direction. The finger electrodes 15 and 17 are X-directed, and the thickness of the oscillator is in the Y direction. The finger-electrode members 15, 17 alternate, in space, with the finger-electrode members 15 of the first array 22, attached to one conductive side rod 30, alternating with the finger-electrode members 17 of the second array 24, attached to the other conductive side rod 32. An input voltage from a source (not shown) is connected between the side rods 30, 32 and between adjacent members 15, 17 of the two arrays 22, 24 so that their voltages are oppositely phased. The conductive side rods 30, 32 are not positioned near the piezoelectric layer oscillator member 18, but they are laterally displaced therefrom on a raised dielectric pedestal 34, and voltages on the side rod connectors 30, 32 create only an insignificant electric field intensity in the active piezoelectric regions of the oscillator.

The side rods or common connectors 30, 32 are supported away from the active piezoelectric region 18 by dielectric pedestals 34 or 36.

The juxtaposed finger-electrode members 15, 17, without the conductive side rods 30, 32, form a phased array to produce frequency dependent acoustic beam steering by the transducer. At different frequencies, the phased array steers or launches the acoustic beam from the transducer at different angles.

In a bulk acoustic wave apparatus, the transducer may operate with typical input frequencies in the 100 to 4000 MHz. range. The zero order or undiffracted beams are suppressed by driving the adjacent input finger-electrode members 15, 17 out of phase with oppositely poled signals.

In operation of the first embodiment of input transducer, a radio frequency source (not shown) is connected between the side rods 30, 32 and between the adjacent finger-electrode members 15, 17, causing alternating electric fields to be concentrated locally in the piezoelectric oscillator member 18. The adjacent alternating fields are oppositely poled to launch steered acoustic waves, at the radio frequency. With the new phased array electrode pattern, not only is the undiffracted mode of acoustical waves suppressed, but also two beams of first order waves are launched symmetrically into the body 10.

Figure 6:
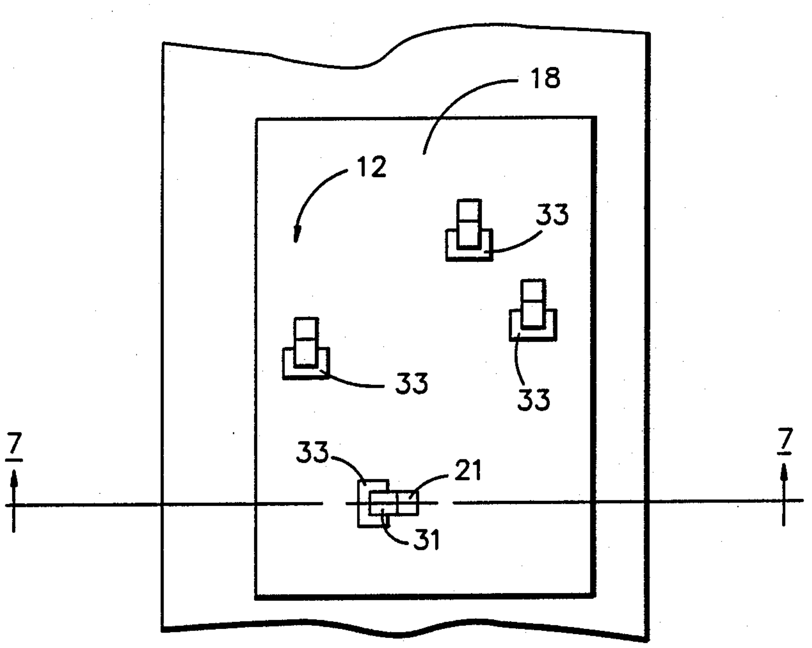
FIG. 6 is a top view of the outside of a second embodiment of the transducer of the invention.
Figure 7:
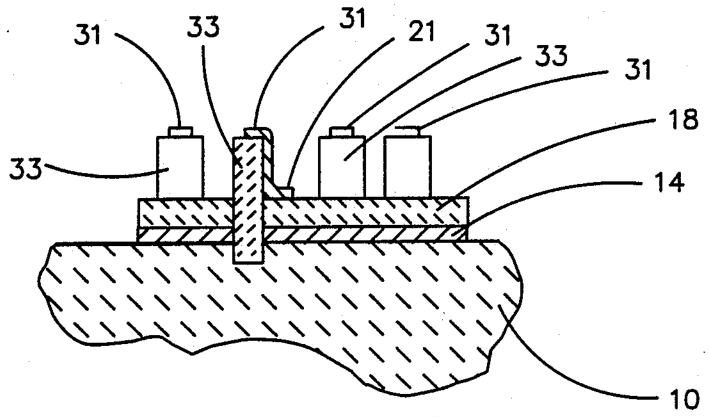
FIG. 7 is a sectional view, taken at 7—7 in FIG. 6.

In the second electrode embodiment, shown in FIGS. 6 and 7, individual electrodes 21 are mounted upon the oscillator 18. Each electric pad has an adjacent built-up supporter pad region 33 which supports connector pads 31 for that particular electrode. The supporter pads are fabricated, as described above, to connect the electrode to outside connectors (not shown).

When the electrodes of the transducer are attached, one-to-one to corresponding antennas of an antenna array, and when the relative geometric positions of the electrodes 21 are the same as the relative geometric positions of the antennas to which they are attached, the transducer launches an acoustic beam, into the bulk acoustic body, that is an acoustic analog of the far field of the antenna array.

Further, when the BAW angle sensor is bidirectional, as it is in the apparatus of the patent application filed on the same date herewith, the transducer may be used to direct transmission of electromagnetic waves in particular directions. The output of the BAW device is energized to cause an acoustic field to intercept the transducer to produce phased voltages on the electrodes which, when transmitted to the antenna array steer the direction of propagation of the electromagnetic signals.

Thus, the transducer has been described, and it is not intended that the invention should be limited by that description, but only by the description taken together with the accompanying claims.

I claim:

1. An acoustic transducer for a bulk acoustic wave body, comprising:
- a bulk acoustic wave body;
- a piezoelectric acoustic oscillator member, formed on said body and having two largest surfaces for receiving electrodes, the distance between said largest surfaces defining the resonant frequency of said member;
- a common electrode covering a first said largest surface of said oscillator member between said oscillator member and said body;
- a plurality of electrode sets, each having a plurality of active electrodes in a predetermined discrete electrode distribution, attached to the second of said largest surfaces of said oscillator member; and
- non-piezoelectric dielectric pedestals, built into said body and positioned in or juxtaposed to said piezoelectric oscillator member for supporting connector-electrodes to said active electrodes and sufficiently far from said active electrodes that electric f ields in the region of said active electrodes, but produced by voltages on said connector-electrodes, are negligible.

2. In combination:
- a piezoelectric acoustic oscillator member having two largest surfaces for receiving electrodes, the distance between said largest surfaces defining the resonant frequency of said member;
- a common electrode covering a first said largest surface of said oscillator member;
- a plurality of electrode sets, each having a plurality of electrodes in a predetermined discrete electrode distribution, attached to the second of said largest surfaces of said oscillator member;
- non-piezoelectric dielectric pedestals, positioned in or juxtaposed to said piezoelectric oscillator member for supporting connector electrodes; and
- a bulk acoustic wave body, attached to said transducer, with dielectric-filled wells therein aligned with said dielectric pedestals.

3. A transducer as recited in claim 1, in which:
- said discrete electrode distribution has two comb electrode sets forming a phased array electrode structure, each with equal numbered pluralities of substantially parallel electrically-conductive finger-electrode members, directed in a first direction and substantially equally-spaced in a row, each said set containing one-half of said finger-electrode members, the finger-electrode members of said sets being juxtaposed and interdigitated such that finger-electrode members adjacent each electrode member of a particular set are finger-electrode members of the other set; and first and second substantially parallel conductive side rods, each said side rod being conductively connected to only one said set of said finger-electrode members; and said side rods being supported upon said dielectric pedestals.

4. A transducer as recited in claim 3 in which said side rods and said finger-electrode members are substantially at right angles to each other.

5. A transducer as recited in claim 4 in which said largest surfaces are substantially flat, X-Y-Z coordinates are defined in said oscillator member, said largest surfaces are parallel to the X-Z axes, said finger-electrode members are X-directed, and the thickness of said oscillator is in the Y direction.

6. A transducer as recited in claim 3 and further comprising non-conductive supports supporting said side rods away from said finger-electrode members.

7. A transducer as recited in claim 6 wherein said side rods are directed parallel to the Z direction, and said supports are positioned at opposite ends of and adjacent said oscillator member.

8. A transducer as recited in claim 1 in which said largest surfaces are substantially flat, X-Y-Z coordinates are defined in said oscillator member, said largest surfaces are parallel to the X-Z axes, said active electrodes are finger-electrode members that are X-directed, and the thickness of said oscillator is in the Y direction.

9. A transducer as recited in claim 8 and further comprising non-conductive supports supporting said side rods away from said finger-electrode members.

10. A transducer as recited in claim 9 wherein said side rods are directed parallel to said Z direction, and said supports are positioned at opposite sides and adjacent said oscillator member.

11. A transducer as recited in claim 1 and further comprising non-conductive supports supporting said side rods away from said active electrode members.

12. A transducer as recited in claim 11 wherein said side rods are directed parallel to said z direction, and said supports are positioned at opposite sides and adjacent said oscillator member.

* * * * *